US012811392B2

(12) United States Patent
Ustianowski

(10) Patent No.: US 12,811,392 B2
(45) Date of Patent: Nov. 24, 2026

(54) SURGE PROTECTOR APPARATUS, SYSTEMS AND METHODS FOR DETECTING A TRANSIENT EVENT

(71) Applicant: NSi Industries, LLC, Huntersville, NC (US)

(72) Inventor: Allen John Ustianowski, Denver, NC (US)

(73) Assignee: NSi Industries, LLC, Huntersville, NC (US)

( * ) Notice: Subject to any disclaimer, the term of this patent is extended or adjusted under 35 U.S.C. 154(b) by 154 days.

(21) Appl. No.: 18/940,743

(22) Filed: Nov. 7, 2024

(65) Prior Publication Data

US 2025/0158391 A1 May 15, 2025

Related U.S. Application Data

(60) Provisional application No. 63/598,042, filed on Nov. 10, 2023.

(51) Int. Cl.

*H02H 9/04* (2006.01)
*G01R 31/327* (2006.01)
*H01C 7/12* (2006.01)

(52) U.S. Cl.

CPC ........... *H02H 9/04* (2013.01); *G01R 31/3277* (2013.01); *H01C 7/12* (2013.01)

(58) Field of Classification Search

CPC ............ H02H 9/04; H02H 9/042; H02H 9/06; H02H 1/00; H02H 3/044; H02H 3/04; H02H 3/05; G01R 31/327; G01R 31/3277; H01C 7/12

USPC .................................................. 361/117–120

See application file for complete search history.

(56) References Cited

U.S. PATENT DOCUMENTS 10,182,484 B1 * 1/2019 Thornton ............... H05B 47/24
2009/0207034 A1 * 8/2009 Tinaphong ............. H02H 9/042 340/635
2016/0161547 A1 * 6/2016 Farquhar, III ......... G01K 13/00 324/549
2017/0063260 A1 * 3/2017 Li ............................ H02P 5/74
2022/0131361 A1 * 4/2022 Garrelts ................... H02H 3/05

(Continued)

*Primary Examiner* — Danny Nguyen

(74) *Attorney, Agent, or Firm* — Shumaker, Loop & Kendrick, LLP; S. Alexander Long, Jr.; Lloyd J. Wilson

(57) ABSTRACT

Surge protector apparatus, systems and methods include metal oxide varistor(s) (MOV(s)) operatively coupled to an electrical system that includes a line side and a load side, the MOV(s) being configured to divert excess voltage during a transient event thereby protecting the load side, processor(s), a communication interface communicatively coupled to the processor(s) and a memory device storing executable code that, when executed causes the processor(s) to monitor sensor data comprising measured voltage levels and detect either that the surge protector apparatus is no longer functional or that an electronic device is deactivated. Notification data of an electronic notification indicating the surge protector apparatus is no longer functional or the electronic device is deactivated is generated. A digital signal representing the sensor data and the notification data is converted to a radio frequency signal that is transmitted to a networking device configured to dispatch the electronic notification to a user device.

20 Claims, 9 Drawing Sheets

(56) References Cited

U.S. PATENT DOCUMENTS

2023/0223749 A1 * 7/2023 Polychronakis ....... H02H 9/041
361/56

* cited by examiner

SURGE PROTECTOR APPARATUS, SYSTEMS AND METHODS FOR DETECTING A TRANSIENT EVENT

CROSS-REFERENCE TO RELATED APPLICATIONS

This application claims priority to and benefit of U.S. Provisional Patent Application No. 63/598,042 filed on Nov. 10, 2023, entitled SURGE PROTECTOR APPARATUS, SYSTEMS AND METHODS FOR DETECTING A TRANSIENT EVENT, the entire contents of which are hereby expressly incorporated by reference.

FIELD OF THE INVENTION

This invention relates generally to the field of surge protection, and more particularly embodiments of the invention relate to a surge protector apparatus, systems and methods for detecting a transient event.

BACKGROUND

Surge protection devices are widely available. However, a user typically is unaware if a surge protection device is operating properly. Existing systems typically illuminate an LED to indicate various conditions associated with the surge protection devices. For example, the LED may be green if the surge protection device is operating properly, or the LED may be red if the surge protection device is not operating properly. However, most users are not frequently monitoring the LEDs on the surge protection devices, and often the surge protection devices are covered up so that the LED is obscured. For example, some surge protection devices may be obscured due to the surge protection devices being built into the wall such that the LED is no longer visible without opening the wall.

Thus, a need exists for improved apparatus, systems and methods.

SUMMARY

Shortcomings of the prior art are overcome and additional advantages are provided through the provision of a surge protector apparatus that includes one or more metal oxide varistors operatively coupled to an electrical system. The electrical system includes a line side and a load side, and the one or more metal oxide varistors are configured to divert excess voltage during a transient event on the line side, thereby protecting the load side. The surge protector apparatus further includes at least one processor, a communication interface communicatively coupled to the at least one processor, and a memory device storing executable code. When the executable code is executed, it causes the at least one processor to, at least in part, monitor sensor data comprising measured voltage levels and status of the one or more metal oxide varistors, the measured voltage levels comprising a voltage measurement of the transient event. The at least one processor detects, from the sensor data, that (i) the surge protector apparatus is no longer functional to divert the excess voltage, or (ii) an electronic device at the load side is deactivated. Notification data of an electronic notification is generated indicating that either (a) the surge protector apparatus is no longer functional to divert the excess voltage, or (b) that the electronic device is deactivated. A digital signal representing the sensor data and the notification data is converted to a radio frequency signal. The radio frequency signal is transmitted, via the communication interface and across a network, to a networking device, wherein the networking device is configured to dispatch the electronic notification and the voltage measurement of the transient event to a user device of a user, the electronic notification indicating that either the surge protector apparatus is no longer functional or that the electronic device is deactivated.

Additionally, disclosed herein is an electrical system. The system includes an electronic device, and a surge protector apparatus. The surge protector apparatus includes one or more metal oxide varistors electrically coupled to the electronic device at a line side of the one or more metal oxide varistors, where the one or more metal oxide varistors are configured to divert excess voltage during the transient event on the line side, thereby protecting a load side of the one or more metal oxide varistors. The surge protector apparatus further includes at least one processor, a communication interface communicatively coupled to the at least one processor, and a memory device storing executable code that, when executed, causes the at least one processor to, at least in part, monitor sensor data comprising measured voltage levels and status of the one or more metal oxide varistors, where the measured voltage levels include a voltage measurement of the transient event. The at least one processor detects that (i) the surge protector apparatus is no longer functional to divert the excess voltage, or (ii) an electronic device at a load side is deactivated. Notification data of an electronic notification is generated indicating that either (a) the surge protector apparatus is no longer functional to divert the excess voltage, or (b) that the electronic device is deactivated. A digital signal representing the sensor data and the notification data is converted to a radio frequency signal, and the radio frequency signal is transmitted, via the communication interface and across a network, to a networking device, wherein the networking device is configured to dispatch the electronic notification and the voltage measurement of the transient event to a user device of a user, the electronic notification indicating that the surge protector apparatus is no longer functional or that the electronic device is deactivated.

Also disclosed herein is a computer-implemented method for transmitting an electronic notification. The computer-implemented method includes, at least in part, monitoring sensor data of a sensor of a surge protector apparatus, the sensor data comprising measured voltage levels and status of one or more metal oxide varistors, the measured voltage levels comprising a voltage measurement of the transient event. The method also includes detecting, from the sensor data, either that (i) the surge protector apparatus is no longer functional to divert the excess voltage, or (ii) an electronic device is deactivated. Based on the detecting, notification data of an electronic notification is generated that indicates either (a) that the surge protector apparatus is no longer functional to divert the excess voltage, or (b) that the electronic device is deactivated. Also, the method includes converting, via a converter, a digital signal representing the sensor data and the notification data to a radio frequency signal, and transmitting, via the communication interface and across a network, the radio frequency signal to a networking device, wherein the networking device is configured to dispatch the electronic notification and the voltage measurement of the transient event to a user device of a user, the electronic notification indicating either that the surge protector apparatus is no longer functional or that the electronic device is deactivated.

The features, functions, and advantages that have been described herein may be achieved independently in various embodiments of the present invention including computer-implemented methods, computer program products, and computing systems or may be combined in yet other embodiments, further details of which can be seen with reference to the following description and drawings.

BRIEF DESCRIPTION

Aspects described herein are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Figure 1A:
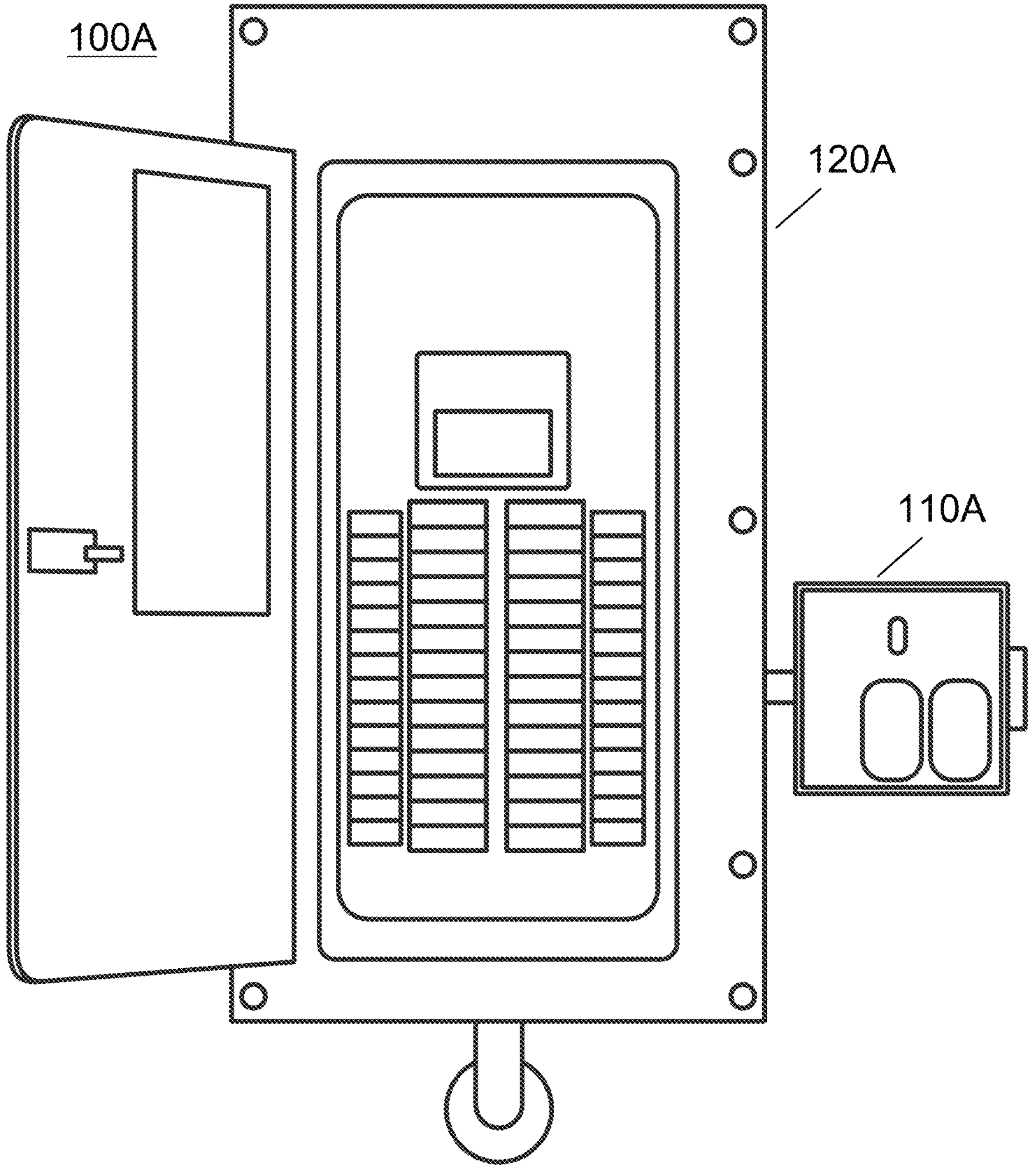
FIG. 1A is a perspective view of an electrical system that includes a surge protector, according to an embodiment of the present invention.

Aspects of the present invention and certain features, advantages, and details thereof are explained more fully below with reference to the non-limiting examples illustrated in the accompanying drawings. It is to be understood that the disclosed embodiments are merely illustrative of the present invention and the invention may take various forms. Further, the figures are not necessarily drawn to scale, as some features may be exaggerated to show details of particular components. Thus, specific structural and functional details illustrated herein are not to be interpreted as limiting, but merely as a representative basis for teaching one skilled in the art to employ the present invention.

Descriptions of well-known processing techniques, systems, components, etc. are omitted to avoid obscuring the invention with well-known details. It should be understood that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular embodiment of the concepts disclosed herein.

The specification may include references to "one embodiment," "an embodiment," "various embodiments," "one or more embodiments," etc. may indicate that the embodiment(s) described may include a particular feature, structure or characteristic, but every embodiment may not necessarily include the particular feature, structure, or characteristic. In some cases, such phrases are not necessarily referencing the same embodiment. When a particular feature, structure, or characteristic is described in connection with an embodiment, such description can be combined with features, structures, or characteristics described in connection with other embodiments, regardless of whether such combinations are explicitly described. Thus, unless described or implied as exclusive alternatives, features throughout the drawings and descriptions should be taken as cumulative, such that features expressly associated with some particular embodiments can be combined with other embodiments.

Unless defined otherwise, technical and scientific terms used herein have the same meaning as commonly understood to one of ordinary skill in the art to which the presently disclosed subject matter pertains.

The exemplary embodiments are provided so that this disclosure will be both thorough and complete, and will fully convey the scope of the invention and enable one of ordinary skill in the art to make, use, and practice the invention.

The terms "couple," "coupled," "couples," "coupling," "fixed," "attached to", and the like should be broadly understood to refer to connecting two or more elements or signals electrically and/or mechanically, either directly or indirectly through intervening circuitry and/or elements. Two or more electrical elements may be electrically coupled, either direct or indirectly, but not be mechanically coupled; two or more mechanical elements may be mechanically coupled, either direct or indirectly, but not be electrically coupled; two or more electrical elements may be mechanically coupled, directly or indirectly, but not be electrically coupled. Coupling (whether only mechanical, only electrical, or both) may be for any length of time, e.g., permanent or semi-permanent or only for an instant. "Communicatively coupled to" and "operatively coupled to" can refer to physically and/or electrically related components.

In addition, as used herein, the terms "about," "approximately," or "substantially" for any numerical values or ranges indicate a suitable dimensional tolerance that allows the device, part, or collection of components to function for its intended purpose as described herein.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the herein described embodiments can be configured without departing from the scope and spirit of the invention. Therefore, it is to be understood that, within the scope of the included claims, the invention may be practiced other than as specifically described herein.

Additionally, illustrative embodiments are described below using specific code, designs, architectures, protocols, layouts, schematics, or tools only as examples, and not by way of limitation. Furthermore, the illustrative embodiments are described in certain instances using particular software, tools, or data processing environments only as example for clarity of description. The illustrative embodiments can be used in conjunction with other comparable or similarly purposed structures, systems, applications, or architectures. One or more aspects of an illustrative embodiment can be implemented in hardware, software, or a combination thereof.

As understood by one skilled in the art, program code can include both software and hardware. For example, program code in certain embodiments of the present invention can include fixed function hardware, while other embodiments can utilize a software-based implementation of the functionality described. Certain embodiments combine both types of program code.

As used herein, the term “provider” generally describes a person or business enterprise that hosts, maintains, otherwise provides, and/or uses computer systems that provide functionality for the disclosed systems and methods. In particular, the term “provider” may generally describe a person or business enterprise providing goods or services accessible via one or more user devices. Interactions between a provider system and a user device may utilize a communicative interaction between a computing system of the provider, and a user device of a user. For instance, user(s) may provide various inputs to a user device that can be interpreted and analyzed using processing systems of the user device and/or processing systems of the provider system. Further, the provider system and the user device may be in communication via a network. According to various embodiments, the provider system and/or user device(s) may also be in communication with external or third party devices (e.g., a third-party server) of a third-party system that may be used to perform one or more computing operations. In some embodiments, the functions of one illustrated system or server may be provided by multiple systems, servers, or computing devices, including those physically located at a central computer processing facility and/or those physically located at remote locations.

Embodiments of the present invention are described herein, with reference to flowchart illustrations and/or block diagrams of computer-implemented methods and computing systems according to embodiments of the invention. Each block of the flowchart illustrations and/or block diagrams, and combinations of blocks in the flowchart illustrations and/or block diagrams, can be implemented by computer readable program instructions that may be provided to a processor of a general purpose computer, special purpose computer, or other programmable data processing apparatus or apparatuses (the term “apparatus” includes systems and computer program products). In particular, the computer readable program instructions, which be executed via the processor of the computer or other programmable data processing apparatus, create a means for implementing the functions/acts specified in the flowchart and/or block diagram block or blocks.

In one embodiment, these computer readable program instructions may also be stored in one or more computer-readable storage media that can direct a computer or other programmable data processing apparatus, and/or other devices, to function in a particular manger, such that a computer readable storage medium of the one or more computer-readable storage media having instructions stored therein comprises an article of manufacture including instructions which implement aspects of the actions specified in the flowchart illustrations and/or block diagrams. In particular, the computer-readable program instructions may be used to produce a computer-implemented method by executing the instructions to implement the actions specified in the flowchart illustrations and/or block diagram block or blocks. Example computer readable storage media may include, but not be limited to, any electronic storage device, a magnetic storage device, an optical storage device, an electromagnetic storage device, a semiconductor storage device, or any suitable combination of the foregoing. A non-exhaustive list of example computer readable storage media include a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a microdrive, a mechanically encoded device such as punch-cards or raised structures in a groove having instructions recorded thereon, and any suitable combination of the foregoing. Computer readable storage media, as used herein, may be used for long-term, intermediate-term, and/or short-term storage of computer-readable instructions, but is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

In another embodiment, these computer program instructions may also be stored in a computer-readable memory that can direct a computer or other programmable data processing apparatus to function in a particular manner, such that the instructions stored in the computer readable memory produce an article of manufacture including instructions, which implement the function/act specified in the flowchart and/or block diagram block or blocks.

Example computer program instructions may include assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language (e.g., Java, Ruby, Python, C#, hypertext preprocessor (PHP), C++, or the like, and procedural programming languages, such as FORTRAN, BASIC, the “C” programming language, or similar programming languages.

The computer program instructions, whether stored in the computer-readable storage medium and/or computer-readable memory may also be loaded onto a computer or other programmable data processing apparatus to cause a series of operational steps to be performed on the computer or other programmable apparatus to produce a computer implemented process such that the instructions, which execute on the computer or other programmable apparatus, provide steps for implementing the functions/acts specified in the flowchart and/or block diagram block or blocks. Alternatively, computer program implemented steps or acts may be combined with operator or human implemented steps or acts in order to carry out an embodiment of the invention.

In the flowchart illustrations and/or block diagrams disclosed herein, each block in the flowchart/diagrams may represent a module, segment, a specific instruction/function or portion of instructions/functions, and incorporates one or more executable instructions for implementing the specified logical function(s). Additionally, the alternative implementations and processes may also incorporate various blocks of the flowcharts and block diagrams. For instance, in some implementations the functions noted in the blocks may occur out of the order noted in the figures. For example, two blocks shown in succession may be executed substantially concurrently, or the functions of the blocks may sometimes be executed in the reverse order, depending upon the functionality involved.

A transient event can occur due to, for example, a lightning strike, switching power, opening circuit breakers, and/or other various surge events. When a transient event/surge occurs, the electrical system can become damaged. This can be particularly detrimental if the equipment is expensive or vital to important operations including lifesaving equipment at a hospital, safety equipment at a chemical plant, manufacturing equipment at a manufacturing facility, or various other electrical equipment. A surge protector, according to a non-limiting embodiment, may be any device that is inserted in an alternating current (AC) utility line and/or telephone line to protect a load (e.g., electrical equipment) from a transient event (e.g., a voltage spike). In particular, the surge protector may be designed to protect electrical wiring, electrical circuits, and/or electrical sockets by either blocking or shorting to ground excess voltage that is above a predetermined operational limit. A surge protector can be placed at various locations depending on the need. For example, the surge protector can be placed next to an electrical control panel (e.g., an area protecting multiple devices), an air conditioning disconnect, a transformer, and/or close to an incoming power source. In some cases surge protectors are designed to shut off an electronic device (e.g., a compressor) when the voltage is wrong in order to protect the electrical device. Oftentimes, surge protectors are configured to take the damage resulting from a transient event and be sacrificial when they absorb excess voltage so that other more expensive or critical electronic devices are protected. Thus, a need exists to alert users that the surge protector has been sacrificed and needs to be replaced.

In some instances, the surge protector apparatus may include a light emitting diode (LED) that illuminates green when it is functional and illuminates red when it fails and is no longer functional. However, many users may not know or be accustomed to visually observing the LED of the surge protector apparatus in order to determine whether the surge protector apparatus is functional. In some cases, the surge protector apparatus may be built into a wall or otherwise obscured so that a user would not be able to visually observe the LED. Thus, a need exists to better notify users that the surge protector apparatus needs to be replaced due to damage.

A new and novel approach to notifying users that the surge protector apparatus is no longer working or has failed or that the surge protector apparatus has shut off an electronic device (e.g., a compressor) is disclosed herein. Advantageously, the disclosed apparatus, systems, and methods enable users to relay the notification to their electric utility provider, an electrician, or other third party to remedy the situation. This notification process helps users to better maintain their electrical equipment and be more aware of issues that may arise related to their electrical system. This notification process is different from any existing Wi-Fi related power strip technology that would merely provide a user with a capability to turn on or off a power strip.

FIG. 1A is a perspective view of an electrical system 100A that includes a surge protector 110A, according to an embodiment of the present invention. In this example implementation, the surge protector is operatively connected to a control panel 120A (i.e., breaker box) such that the surge protector can protect downstream electronic equipment.

Figure 1B:
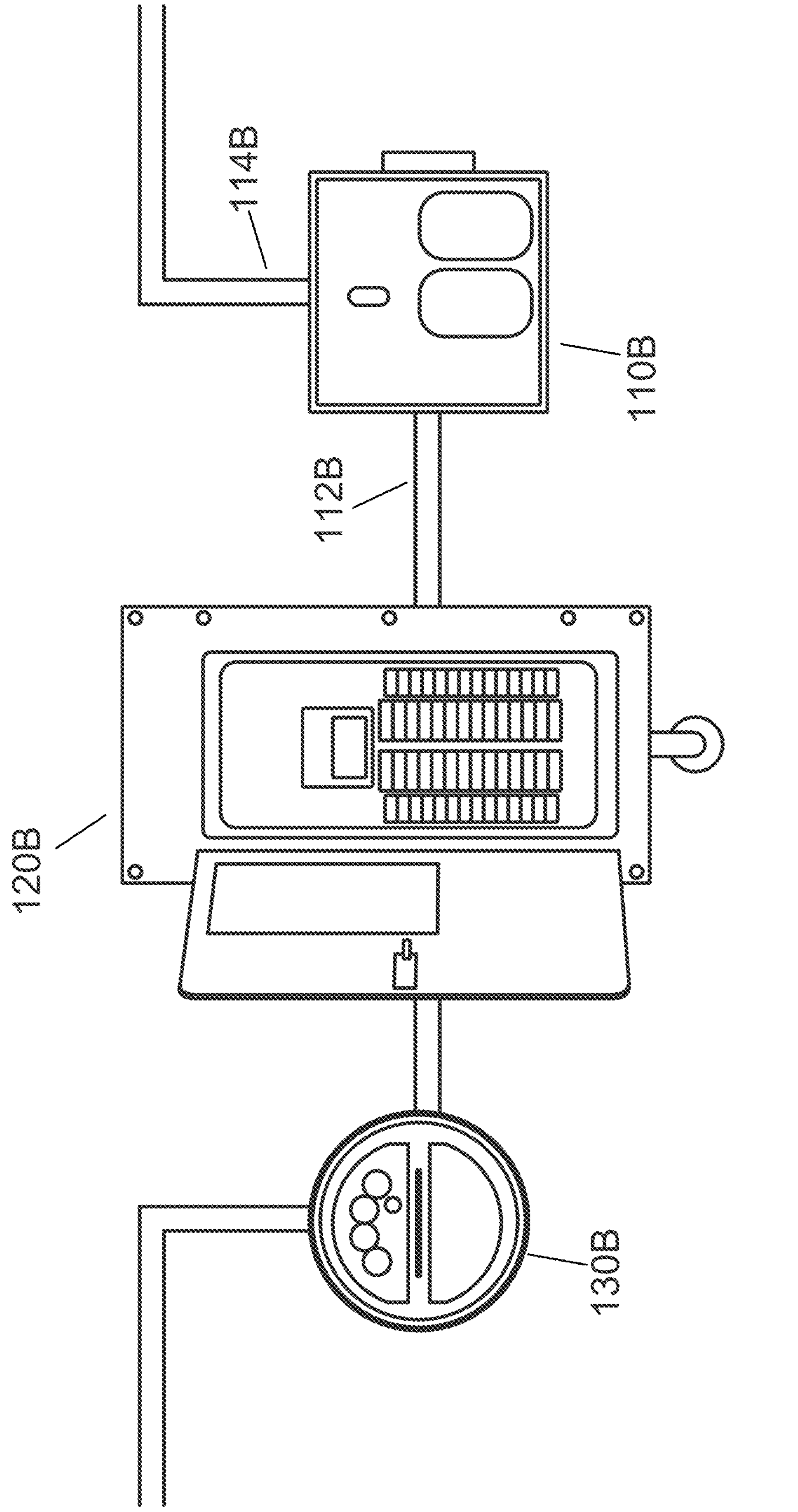
FIG. 1B is a diagram of an electrical system that includes a surge protector, according to an embodiment of the present invention.

FIG. 1B is a diagram of an electrical system 100B that includes a surge protector 110B, according to an embodiment of the present invention. On the line side 112B of the surge protector 110B, the surge protector 110B is electrically connected to a control panel 120B (i.e., breaker box), which is electrically connected to a power meter 130B. The power meter 130 may be electrically connected (e.g., through an AC power line) to a power source. On the load side 114B of the surge protector 110B, various electronic devices may be electrically connected to the surge protector 110B.

Figure 2A:
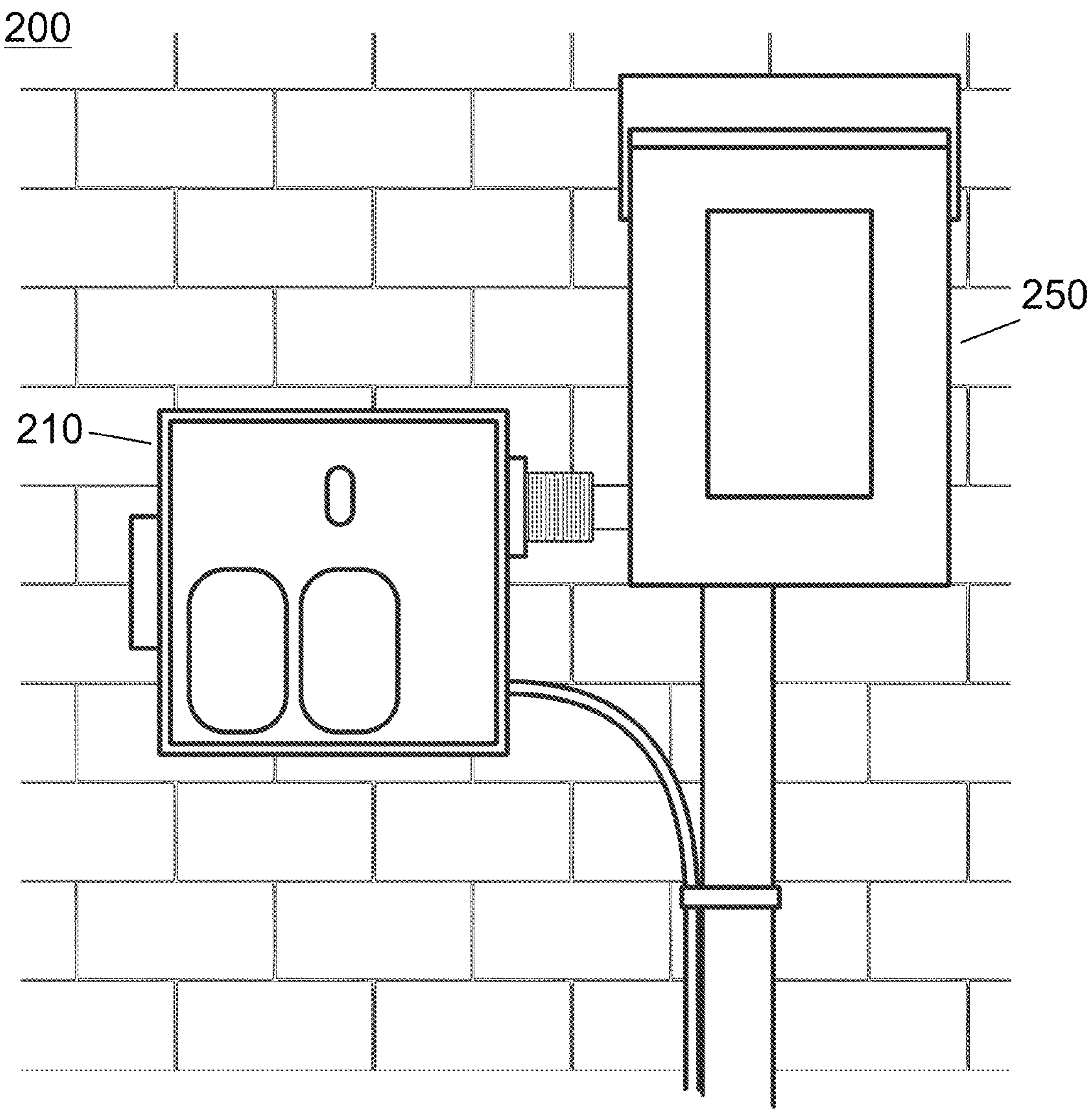
FIG. 2A is a perspective view of an electrical system that includes a surge protector, according to an embodiment of the present invention

FIG. 2A is a perspective view of an electrical system 200 that includes a surge protector 210, according to an embodiment of the present invention. The electrical system 200 may include a surge protector apparatus 210 that is operatively connected to a shutoff switch, which may be electrically coupled to an electronic device such as a compressor of an air conditioning unit.

Figure 2B:
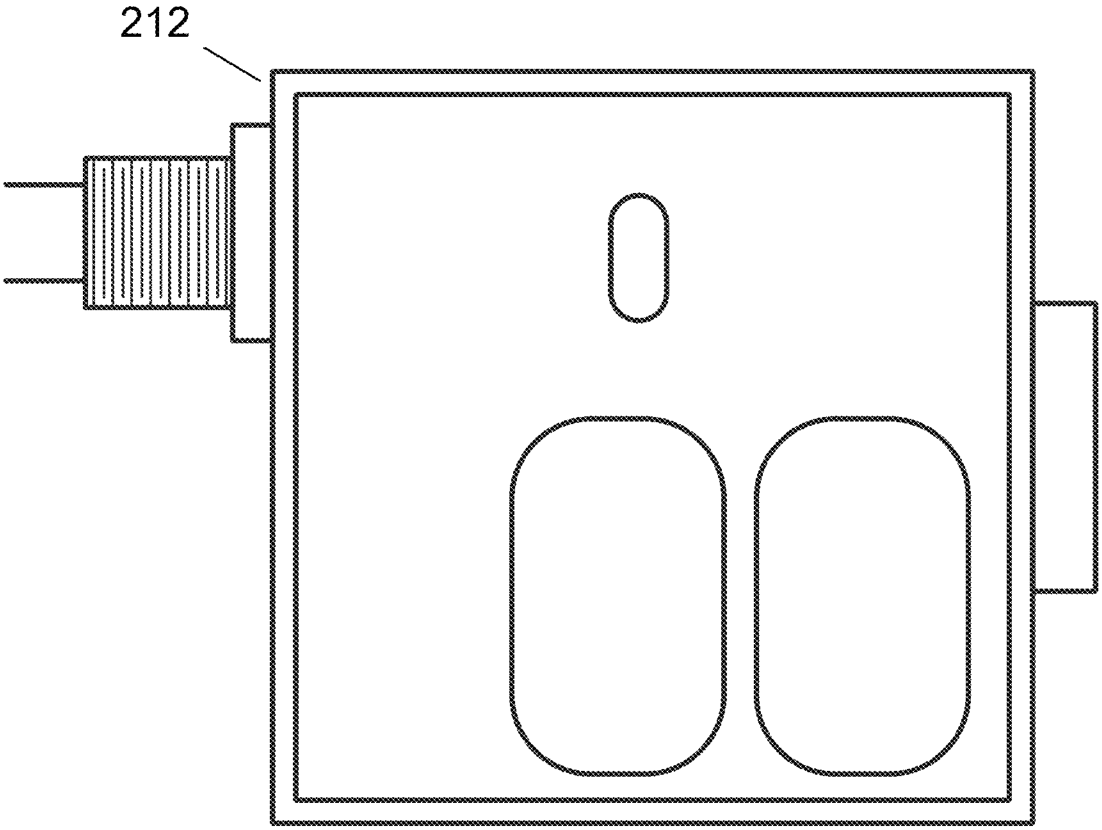
FIG. 2B is a perspective view of a surge protector, according to an embodiment of the present invention.

FIG. 2B is a perspective view of a surge protector 212, according to an embodiment of the present invention.

Figure 3:
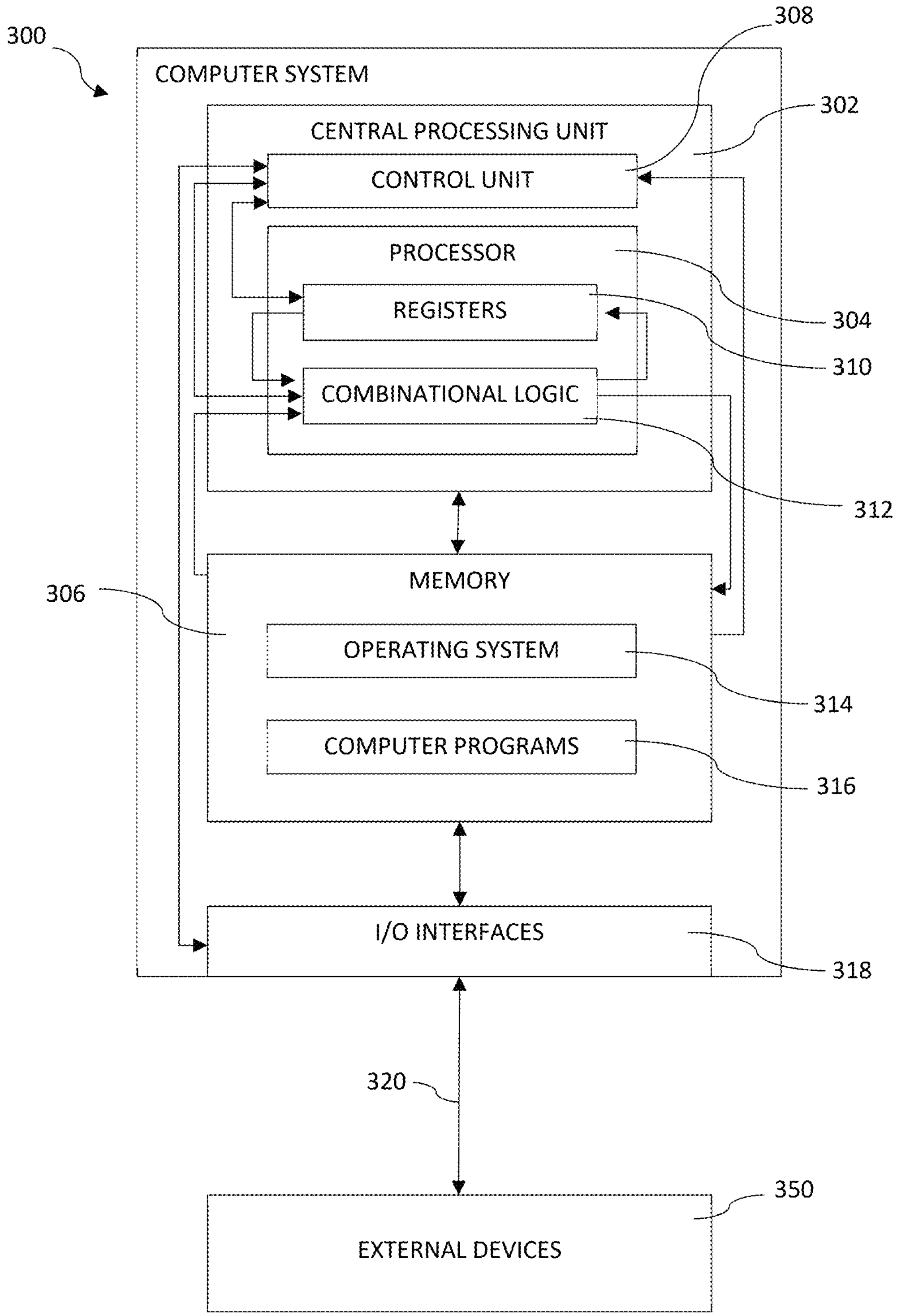
FIG. 3 depicts an example computer system configured to perform various processes described herein, according to an embodiment of the present invention.

FIG. 3 depicts an example computer system 300 configured to perform various processes described herein, according to an embodiment of the present invention. The example computer system 300 may be incorporated into a surge protector apparatus such as those described herein and depicted by FIGS. 1A-2B. The computer system 300 is in communication, via a network, with one or more external device(s) 350, which may include, for example, devices (e.g., server(s)) of a provider system and/or a user device that includes, for example, a laptop, a computer, a tablet, a mobile computing device such as a smart phone, a portable digital assistant, a pager, a television, a gaming device, an audio/video player, a virtual assistant device, an internet-of-things device, a smart home device, a wireless personal response device, any combination of the aforementioned, and/or any other electronic device with processing and communication capabilities. The computer system 300 includes one or more central processing unit(s) 302 (CPU) that includes one or more processor(s) 304. The CPU(s) 302 and/or additional processor(s) 304 include functional components used in the execution of instructions and/or otherwise may be configured to perform a computer-implemented method by executing instructions. For example, the CPU(s) 302 and/or additional processor(s) 304 may include functional components to fetch program instructions from one or more locations such as the memory 306, which may include a cache or main memory. The CPU(s) 302 and/or additional processor(s) 304 may decode the program instructions and execute the program instructions, which may or may not require accessing the memory 306 as part of the instruction execution. Further, the CPU(s) 302 and/or additional processor(s) 304 may write results of the executed instructions to, for example, a destination register for storing the result of the execution, or various other locations for further processing and/or storage. The CPU 302 may include a control unit 308 that directs the operation of the processor(s) 304 and may include, for example, a binary decoder to convert coded instructions into timing and control signals that direct the operation of various other components (e.g., memory 306) of the computer system 300.

Processor(s) 304 may include circuitry for implementing communication and/or logic functions of the computer system 300. The processor(s) 304 may include a digital signal processor, a microprocessor, a graphics processing unit (GPU), a microcontroller, an application-specific integrated circuit (ASIC), a programmable logic device (PLD), digital signal processor (DSP), a field programmable gate array (FPGA), programmable logic arrays (PLA) a state machine, a controller, gated or transistor logic, discrete physical hardware components, various analog to digital converters, digital to analog converters, and/or other support circuits and/or combinations thereof. According to various embodiments, the processor(s) 304 may also include register(s) 310 that are configured as a small amount of fast storage and may be used and/or otherwise accessed by one or more of the functional components for various operations (e.g., arithmetic operations, bitwise operations, etc.). The processor(s) 304 may also utilize a combinational logic system 312 to perform various calculations (e.g., using Boolean algebra) on input signals and stored data to produce specified outputs from such inputs. Control and signal processing functions of the computer system 300 are allocated between these processor(s) 304 according to their respective capabilities based on the functionality used to encode and interleave messages and data prior to modulation and transmission thereof. Processor(s) 304 may include an internal data modem and other functionality to operate software programs (e.g., computer programs 316). In one non-limiting example, the processor(s) 304 may be capable of operating a connectivity program, such as a web browser application, that may then allow the computer system 300 to transmit and receive (e.g., to one or more external device(s) 350) content such as, for example, web content, location-based content, etc. in accordance with a Wireless Application Protocol (WAP), Hypertext Transfer Protocol (HTTP), and/or the like.

The memory 306 may be operatively coupled to the processor(s) 304 and can be or include main or system memory (e.g. RAM), non-volatile memory, volatile memory, or any computer readable storage media used to store data, code or other information that the processor(s) 304 use in the execution of program instructions. Memory 306 can include storage device(s) such as hard drive(s), flash media, optical media, and/or cache memory that may be embedded and/or removable, as examples. Memory 306 can include, for instance, a cache, such as a shared cache, which may be coupled to local caches (examples include L1 cache, L2 cache, etc.) of processor(s) 304. In various embodiments, the memory 306 includes any tangible device that can retain and store instructions for use ban an instruction execution device (e.g., processor(s) 304). The memory 306 can store any number of pieces of information and data used by the computer system 300 to implement functions described herein as well as other functions not expressly described.

Additionally, memory 306 may be or include at least one computer program product having a set (e.g., at least one) of program modules, instructions, code or the like that is/are configured to carry out functions of embodiments described herein when executed by the processor(s) 304. Memory 306 can store an operating system 314, other computer programs 316, such as one or more computer programs/applications that execute to perform aspects described herein, and/or various other data items. Specifically, programs/applications can include computer readable program instructions and code that may be configured to carry out functions of embodiments of aspects described herein, and can also include cashed data, user files, audio files, video recordings, files downloaded or received from other devices, and/or other data items required or related to any or all of the programs/applications. Example programs/applications can include integrated software applications that manage device resources, generate user interfaces, accept user inputs, and facilitate communications with other devices among other functions. The integrated software applications can include an operating system, such as Linux®, UNIX®, Windows®, macOS®, iOS®, Android®, or other operating system compatible with personal computing devices. Programs/applications can also include applications (e.g., a mobile application) considered web-browser applications that typically provide a graphical user interface (GUI) that can be displayed (e.g., via a user interface) and may include features for accepting inputs from users (e.g., via control inputs such as text boxes, data fields, hyperlinks, pull down menus, check boxes, and the like).

Computer system 300 may also include input/output (I/O) interfaces 318 through which external device(s) 350 are connected. Example external device(s) 350 in some examples may include a/an external sever, workstation, set of servers, cloud-based application or system, etc. located outside of the user computer system 300 that the computer system 300 may access via a network such as the Internet. In some examples, external device(s) 350 may additionally or alternatively include electrical components included within the user device itself. Specifically, an I/O device may be incorporated into the computer system 300 itself or the I/O device may be regarded as an external device 350 coupled to the computer system 300 through one or more I/O interfaces 318.

External device(s) 350 can include, but are not limited to, printers, display monitors, microphone(s), speaker(s), Global Positioning System (GPS) devices, camera(s) (e.g., digital cameras), lights, non-transitory storage media (e.g., ROM), accelerometers, gyroscopes, magnetometers, sensor devices configured to sense light, proximity, heart rate, body and/or ambient temperature, blood pressure, and/or skin resistance, activity monitors, a keyboard, a pointing device, a joystick, a button, soft key, infrared sensor, a display screen (e.g., a liquid crystal display (LCD), light emitting diode (LED) display, or the like), a sensitive input screen (e.g., a touch screen or the like), and/or any other devices that enable a user to interact with computer system 300, any device that enables computer system 300 to communicate with one or more other computing systems or peripheral devices, one or more data storage devices, which may store one or more programs, one or more computer readable program instructions, and/or data, etc., removable/non-removable storage media, volatile/non-volatile computer system storage media, a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media, non-volatile magnetic media (typically called a "hard drive"), and/or any other suitable devices adapted to provide an input or output to the computer system 300 and/or commonly used with any suitable operating system on personal computers, central computing systems, phones, and/or similar devices.

I/O interfaces 318 may provide communication (e.g., two-way communication and data exchanges). Example I/O interfaces 318 may additionally or alternatively include, for example, a network interface/adapter that enables the computer system 300 to communicate with one or more networks, such as a local area network (LAN), a general wide area network (WAN), and/or a public network (e.g., the Internet), and/or provide communication with other computing devices or systems, storage devices, or the like. Specific examples of I/O interfaces 318 may also include Ethernet-based (such as Wi-Fi) interfaces, near-field communication devices, transceivers, and/or Bluetooth® adapters. (BLUETOOTH is a registered trademark of Bluetooth SIG, Inc., Kirkland, Washington, U.S.A.). The I/O interfaces 318 may, in some embodiments, be configured as a means for providing user inputs via virtual buttons, selectable options, a virtual keyboard, a touch screen, a touchpad, and other indicia that, when touched, can be used by the user to control the computer system 300. The I/O interfaces 318 may include and/or be operatively connected to circuitry used to convert analog signals and/or other signals into digital data, and/or may be configured to convert digital data to another type of signal. For example, the I/O interfaces 318 may receive and convert physical contact inputs, physical movements, auditory signals, etc. to digital data. Once converted, the digital data may be provided to the processor (s) 304 for processing.

The I/O interfaces 318 may be coupled to processor(s) 304, external device(s), and each other via one or more buses, circuitry, intraconnections, and/or other connections that facilitate communication. Bus connections represent one or more of any of several types of bus structures, including a memory bus or memory controller, a peripheral bus, an accelerated graphics port, a high-speed interface, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI). The bus connections may operatively couple and/or electrically connect various components of the computer system 300 with one another directly or indirectly by way of intermediate components.

The communication between I/O interfaces 318 and external devices 350 can occur across wired and/or wireless communications link(s) 320, such as Ethernet-based wired, universal serial bus (USB) wired or wireless connections. Example wireless connections include cellular, Wi-Fi, Bluetooth®, proximity-based, near field, or other types of wireless connections. More generally, communications link (s) 320 may be any appropriate wireless and/or wired communication link(s) 320 for communicating data. In some instances, the communications link(s) may utilize various modes and/or protocols, including, as non-limiting examples, global system for mobile (GSM) voice communication, short message service (SMS), enterprise messaging service (EMS), multimedia messaging service (MMS) messaging, second-generation (2G) wireless communication protocols IS-95 such as code division multiple access (CDMA), IS-136 such as time division multiple access (TDMA), personal digital cellular (PDC), or general packet radio service (GPRS), third-generation (3G) wireless communication protocols, such as Universal Mobile Telecommunications System (UMTS), CDMA2000, wideband CDMA (WCDMA) and/or time division-synchronous CDMA (TD-SCDMA), fourth-generation (4G) wireless communication protocols such as Long-Term Evolution (LTE), fifth-generation (5G) wireless communication protocols, Bluetooth Low Energy (BLE) communication protocols such as Bluetooth 5.0, ultra-wideband (UWB) communication protocols, and/or the like.

Specific example I/O interfaces 318 that may be used to perform the processes disclosed herein may incorporate and or otherwise be configured to capture an image (e.g., via camera(s) and/or other optical instrument(s)). The I/O interfaces 318 may include one or more lenses and one or more image sensors (e.g., a charge coupled device (CCD) sensor) configured to convert photons into an electrical signal. For example, pixels of each the image sensors may each include a photodiode (e.g., a semiconductor) that becomes electrically charged in accordance with the strength of the light that strikes the photodiode, where the electrical charge is then relayed to be converted to an electrical signal. In one embodiment, a series of pulses may be applied to the one or more image sensors to relay the accumulate charges within each photodiode in succession down a row of photodiodes to an edge of the respective image sensor. Other optical instrument functionalities are also contemplated herein.

In various embodiments, the I/O interfaces 318 may be configured to obtain and/or process various forms of authentication by obtaining authentication information from a user of a user device accessing or that otherwise incorporates the computer system 300. The authentication information may be provided, for example, to access specific information that is restricted to authorized users. In one example, a restricted web portal may require login credentials from the user in order to provide the user with access to the web portal and perform various functionalities therethrough. Various authentication systems may include, according to various embodiments, a recognition system that detects biometric features or attributes of a user such as, for example fingerprint recognition systems and the like (hand print recognition systems, palm print recognition systems, etc.), iris recognition and the like used to authenticate a user based on features of the user's eyes, facial recognition systems based on facial features of the user, DNA-based authentication, or any other suitable biometric attribute or information associated with a user. Additionally or alternatively, voice biometric systems may be used to authenticate a user using speech recognition associated with a word, phrase, tone, or other voice-related features of the user. Alternate authentication systems may include one or more systems to identify a user based on a visual or temporal pattern of inputs provided by the user. For instance, the user device may display, for example, selectable options, shapes, inputs, buttons, numeric representations, etc. that must be selected in a pre-determined specified order or according to a specific pattern. Other authentication processes are also contemplated herein including, for example, email authentication, password protected authentication, device verification of saved devices, code-generated authentication, text message authentication, phone call authentication, etc. The user device may enable users to input any number or combination of authentication systems. For instance, in some cases, in order to authenticate a user, the user may be required to provide multi-factor authentication by requiring more than one authentication method.

In various embodiments, the I/O interfaces 318 may include a positioning device and/or otherwise be configured to identify a geographic location of a user device using a positioning system. For example, the I/O interfaces 318 may include a GPS transceiver, an antenna, transmitter, and/or receiver that can be used, via triangulation of cellular signals, to identify an approximate location of a user device.

In some embodiments, particular portions or steps of methods and functions described herein are performed in whole or in part by way of the CPU 302, processor(s) 304, and/or cloud-based computing devices/systems such that the computer system 300 facilitates operations that may only partially be performed locally and may incorporate communication, data transfer, and/or user inputs and outputs.

According to various embodiments, the user of the computer system 300 can be any individual, a group, entity, etc. that is in possession of or has access to a user device which may be personal or public devices used to access the computer system 300. The user can provide inputs to the computer system 300 through, for example, user-side actions including voice, text, movement, and/or graphical indicia selections Computer system 300 may be operational with numerous other general purpose or special purpose computing system environments or configurations. Computer system 300 may take any of various forms, well-known examples of which include, but are not limited to, personal computer (PC) system(s), server computer system(s), such as messaging server(s), thin client(s), thick client(s), workstation(s), laptop(s), handheld device(s), mobile device(s)/computer(s) such as smartphone(s), tablet(s), and wearable device(s), multiprocessor system(s), microprocessor-based system(s), telephony device(s), network appliance(s) (such as edge appliance(s)), virtualization device(s), storage controller(s), set top box(es), programmable consumer electronic(s), network PC(s), minicomputer system(s), mainframe computer system(s), and distributed cloud computing environment(s) that include any of the above systems or devices, and the like. The computer system 300 may also be referred to herein as a data processing device/system, computing device/system/node, or simply a computer. The computer system 300 may be based on one or more of various system architectures and/or instruction set architectures.

Figure 4:
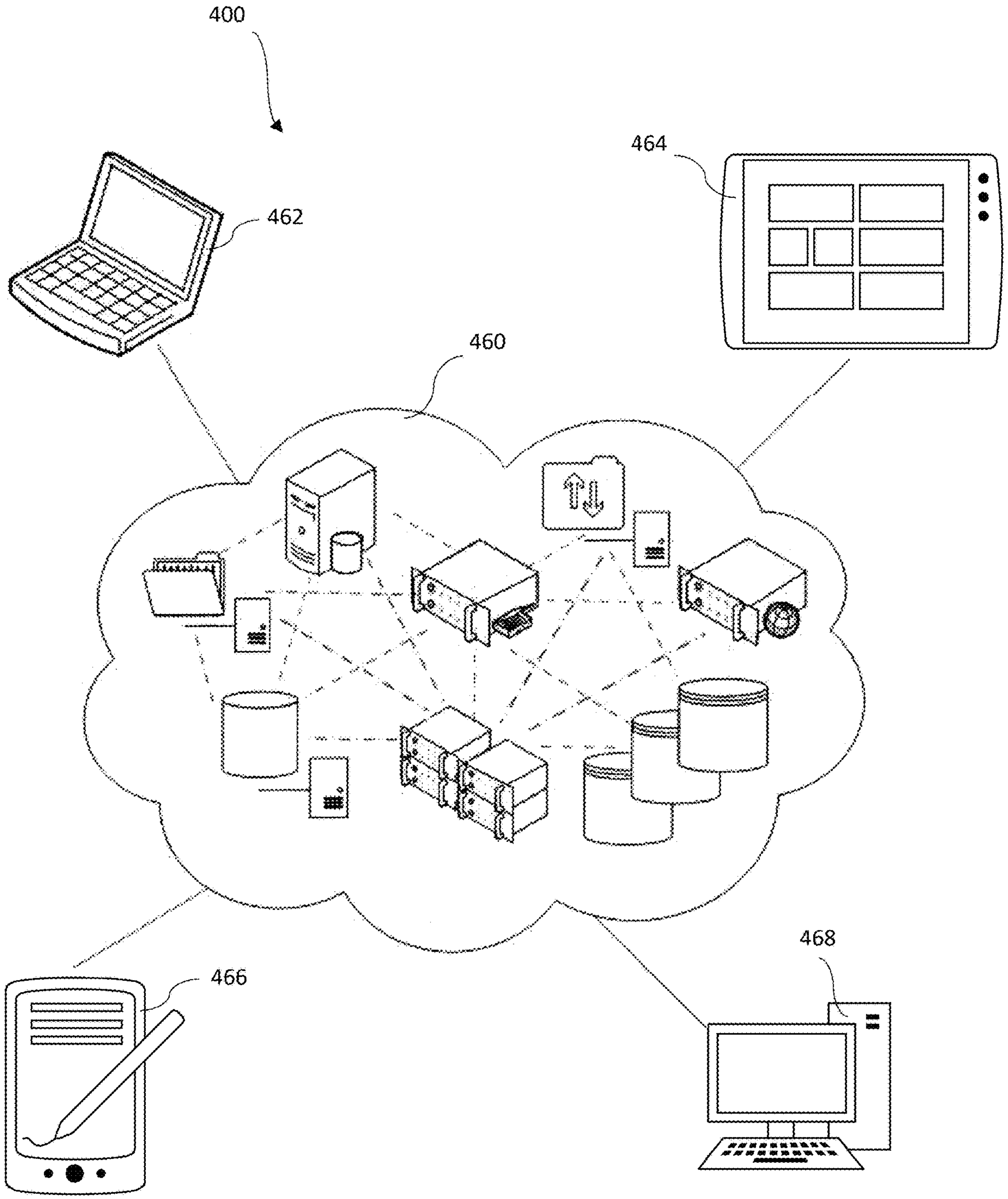
FIG. 4 depicts an example cloud computing environment, according to an embodiment of the present invention.

FIG. 4 depicts an example cloud-computing environment 400, according to an embodiment of the present invention. The cloud-computing environment 400 may be provided by a "provider" and include a network 460 that is communicatively connected, via wireless and/or wired connections to various network devices that may be local and/or remote to one another. Example network devices may include the user devices, such as laptop 462, tablet 464, smart phone 466, and/or desktop 468, as well as various other computing devices, mobile devices, and/or servers. As depicted, the network 460 can be a large distributed network that includes multiple servers (e.g., file servers, catalog servers, computing servers, application servers, etc.), databases, storage locations, and/or computers. In one particular embodiment, the network devices include a wireless router (i.e., a Wi-Fi hub) configured to receive a radio signal from a surge protector apparatus and decode the signal. The wireless router then dispatches information via the Internet via a modem and a physical, wired Ethernet connection.

The network 460 may facilitate sharing data and/or resources across distributed locations. Although singly depicted with one network 460 for illustrative convenience, the cloud-computing environment 400 may include more than one network without departing from the scope of this description. In some embodiments, the network 460 may be or include a secured network. In some embodiments, the network 460 may be implemented, at least in part, through one or more connections to the Internet. In some embodiments, a portion of the network 460 may include a virtual private network (VPN) or an Intranet.

The cloud-computing environment 400 may also include wired and wireless links, including, as non-limiting examples, 802.11a/b/g/n/ac, 802.20, WiMAX, LTE, and/or any other wireless link. The network 460 may include any internal or external network, networks, sub-network, and combinations of such operable to implement communications between various computing components within and beyond the illustrated cloud-computing environment 400. The network 460 may communicate, for example, Internet Protocol (IP) packets, frames using frame relay, voice, video, data, and other suitable information between network addresses. The network 460 may also include one or more local area networks (LANs), radio access networks (RANs), metropolitan area networks (MANs), wide area networks (WANs), personal area networks (PANs), WLANs, campus area network (CAN), storage-area network (SAN), all or a portion of the internet and/or any other communication system or systems at one or more locations.

The network 460 may incorporate various cloud-based deployment models including, for example, private cloud (i.e., an organization-based cloud managed by either the organization or third parties and hosted on-premises or off premises), public cloud (i.e., cloud-based infrastructure available to the general public that is owned by an organization that sells cloud services), community cloud (i.e., cloud-based infrastructure shared by several organizations and manages by the organizations or third parties and hosted on-premises or off premises), and/or hybrid cloud (i.e., composed of two or more clouds e.g., private community, and/or public that remain unique entities but are bound together by standardized or proprietary technology that enables data and application portability (e.g., load-balancing between cloud networks).

At least some of the network devices, such as the user devices (e.g., laptop 462, tablet 464, smart phone 466, and desktop 468) may include a computer system, such as the computer system 300 of FIG. 3. The network 460 may also include any number of data sources, user devices, consumers, customers, third-party devices, external databases, servers, etc. from any number of users (e.g., individual persons, institutions, companies, organizational entities, groups, etc.). In some embodiments, the network 460 incorporates any number of virtual resources, such as cloud resources or virtual machines. Virtual resources may utilize a cloud-computing configuration to provide an infrastructure that includes a network of interconnected nodes and provides stateless, low coupling, modularity and semantic interoperability. Such interconnected nodes may incorporate a computer system that includes one or more processors, a memory, and a bus that couples various system components (e.g., the memory) to the processor, and may be grouped physically or virtually in one or more networks. It should be understood that such interconnected nodes may include the types of computing devices and systems depicted, as an example, in FIG. 3, which is intended to be illustrative only, and such interconnected nodes can communicate with any type of computerized device across the network 460. Such virtual resources may be available for shared use among multiple distinct resource consumers and in certain implementations, virtual resources do not necessarily correspond to one or more specific pieces of hardware, but rather to a collection of pieces of hardware operatively coupled within a cloud-computing configuration so that the resources may be shared as needed.

Cloud computing utilized by the cloud-computing environment 400 is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. Processes described herein may be performed singly or collectively by one or more computer systems (e.g., such as computer system 300) that are accessible via the network 460. It is to be understood that although this disclosure includes a detailed description on cloud computing, implementation of the teachings recited herein are not limited to a cloud-computing environment. Rather, embodiments of the present invention are capable of being implemented in conjunction with any other type of computing environment now known or later developed.

The network 460 of the cloud-computing environment 400 may be configured to be accessed by a network device (e.g., laptop 462, tablet 464, smart phone 466, and desktop 468) to provision computing capabilities, such as server time and network storage, as needed without requiring human interaction with the provider. Further, the network 460 may be accessed through standard computer systems (e.g., via I/O interfaces 318 of computer system 300) used by thin or thick client platforms (e.g., mobile phones, laptops, PDAs, etc.). Further, the network 460 may pool computing resources to serve multiple network devices using, for example, a multi-tenant model with various physical and virtual resources assigned in accordance with demand. For instance, physical and/or virtual resources accessed via the network 460 may be dynamically assigned and reassigned to different end-users such that the end-user has no control or knowledge of the exact location of the provider resources accessed via the network 460, although general abstraction may be used to identify a datacenter location, city, state, country, etc. The network 460 may also be scaled and provisioned, sometimes automatically, rapidly and elastically based on various functionality requirements and/or usages. In some instances, the network resources available via the network 460 may be regulated based on a metering capability (e.g., based on storage, processing, bandwidth, active user accounts, etc.).

Figure 5:
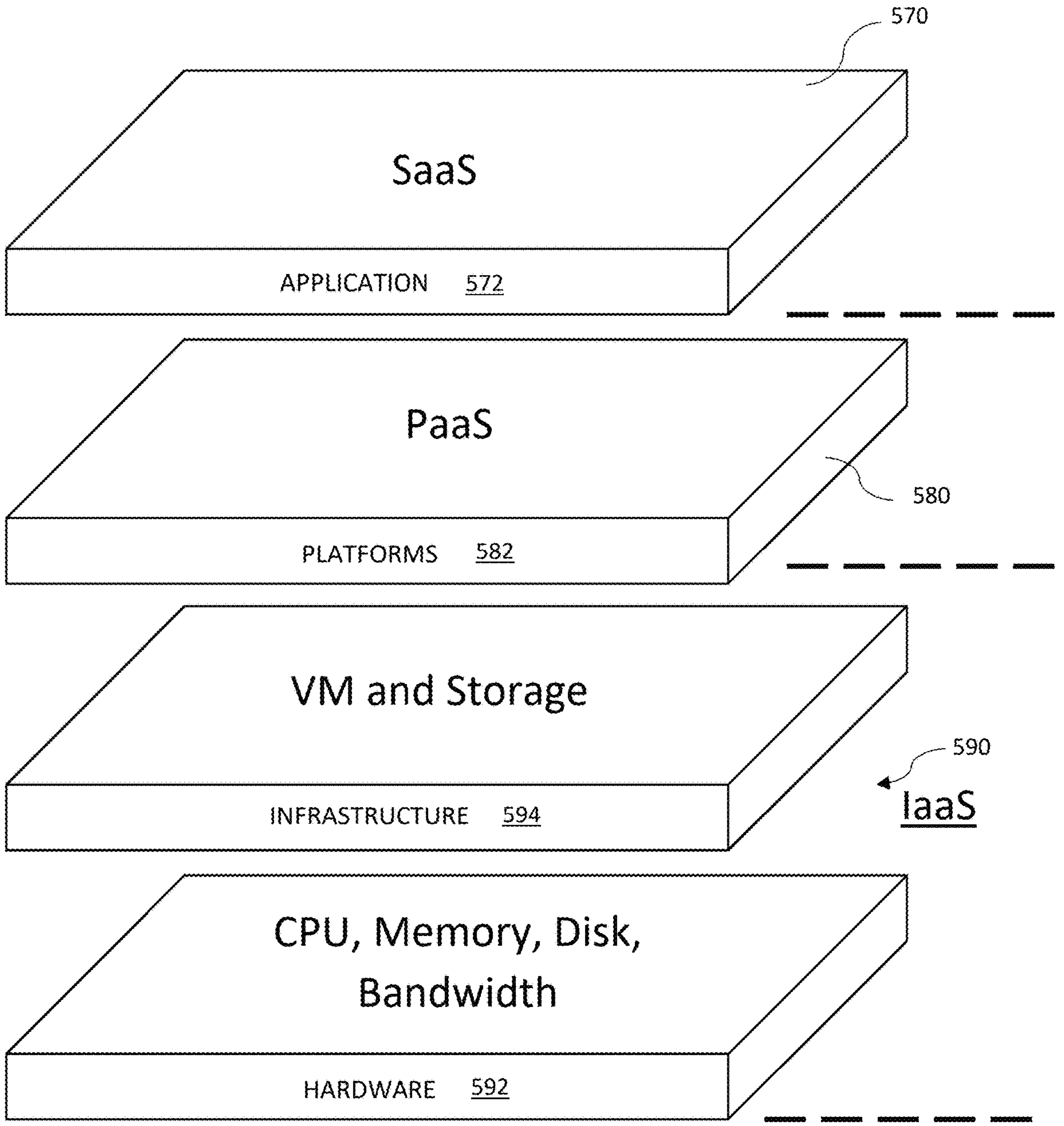
FIG. 5 depicts an example of cloud computing layers, according to an embodiment of the present invention.

FIG. 5 depicts an example of cloud computing services, according to an embodiment of the present invention. The cloud computing services may be utilized by a cloud computing environment (e.g., cloud-computing environment 400) and may include a Software-as-a-Service (SaaS) 570, a Platform as a Service (PaaS) 580, and/or an Infrastructure as a Service (IaaS) 590. The cloud computing services offer infrastructure, platforms, and/or applications/software as services to and end-user so that the end-user does not need to maintain resources on a local computing device.

The SaaS service 570 may provide an end-user with the ability to use the provider's applications that are accessible and operable via cloud infrastructure. Specifically, the provider's applications layer 572 may be accessible via various network devices that include computer systems (e.g., computer system 300) via, for example, a thin client interface such as a web browser. With the SaaS model, the end-user is not authorized to manage or control the underlying cloud infrastructure, network, servers, operating systems, storage, or individual application capabilities offered by the provider, with the exception of limited user-specific application configuration settings.

The PaaS service 580 may provide the end-user with the ability to deploy consumer-created or acquired applications onto the cloud infrastructure using a platform layer 582, where the consumer-created applications may be created using programming languages and tools supported by the provider. Specifically, the end-user is not authorized to manage or control the underlying cloud infrastructure including networks, servers, operating systems, or storage. However, the end-user is authorized to control the deployed applications and possibly application hosting environment configurations available via the platform layer 582.

The IaaS 590 service may provide the end-user with the ability to provision processing, storage, networks, and other fundamental computing resources. The IaaS service includes a hardware layer 592 that is responsible for managing the physical resources available via the cloud-computing environment (e.g., cloud-computing environment 400). Specifically, the hardware layer 592 may include physical servers, routers, switches, power and cooling systems and may, according to one embodiment, be implemented using one or more data centers that incorporate many (e.g., hundreds, thousands, etc.) of interconnected servers, CPUs, mainframes, reduced instruction set computer (RISC), architecture based servers, blade servers, storage devices, network computing components, memory, disk, bandwidth, etc. organized through switches, routers, and/or other fabrics.

IaaS service 590 may also include an infrastructure layer (e.g., a virtualization layer) 594 that includes virtual machine capabilities and storage capabilities using computing resources that may be partitioned using various virtualization technologies (e.g., a hypervisor that runs directly on the system hardware (e.g., Xen), a kernel-based virtual machine (KVM), Hyper-V virtualization, VMware software, etc.). With IaaS service 390, the end-user may be able to deploy and run arbitrary software, which can include operating systems and applications, via the virtual machines. Although the end-user would not be authorized to manage or control the underlying cloud infrastructure, the end-user would be authorized to control operating systems, storage, deployed applications, and some limited network components (e.g., host firewalls).

According to one embodiment, the provider provides users with access to a SaaS service 570 using a computer system of a user device that can display, via a user interface of the user device, a log of measured voltage levels. The user interface may differentiate, via color or another type of visual identifier, a voltage measurement of the transient event. The user may also enable push notifications via the SaaS service 570 in order to receive a pop-up alert or other message even if the application associated with the SaaS service 570 is not open or in use. In some embodiments, the SaaS service 570 may be configured to allow users to provide, via a text box or other control input, contact information so that the user can receive an electronic notification through email, SMS text, or other electronic process.

Although various embodiments are described above, these are only examples. For example, computing environments of other architectures can be used to incorporate and use one or more embodiments.

Figure 6:
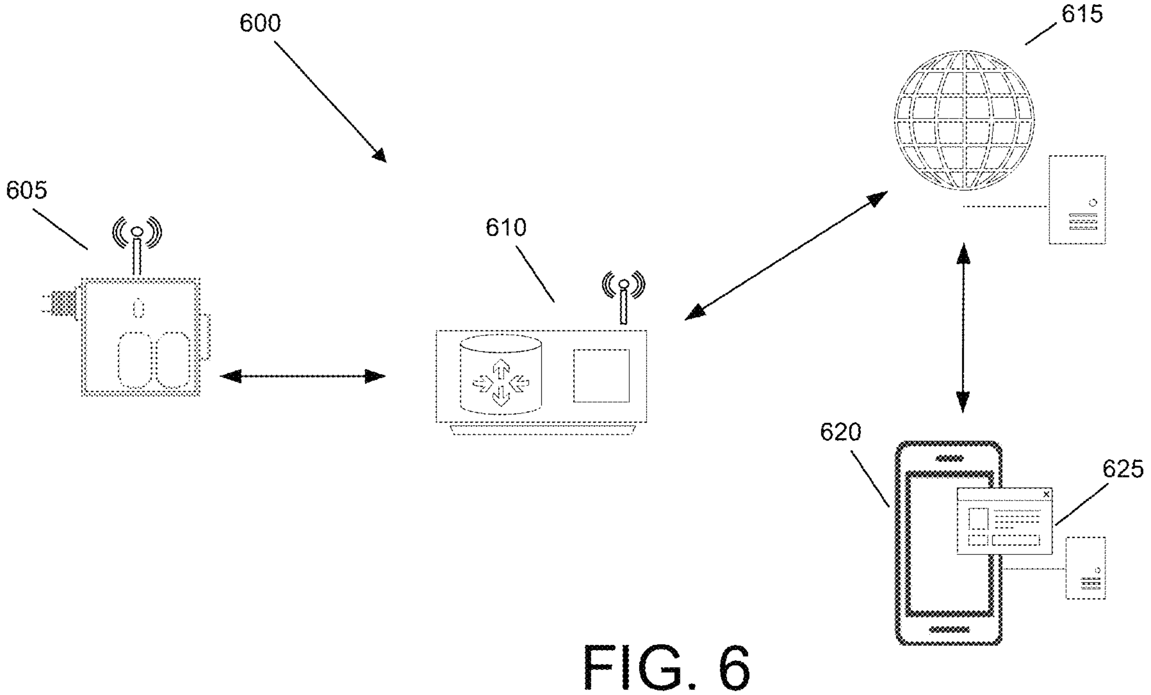
FIG. 6 depicts an example network environment configured to perform various processes described herein, according to an embodiment of the present invention.

FIG. 6 depicts an example network environment 600 configured to perform various processes described herein, according to an embodiment of the present invention. A surge protector 605 may be configured to transmit a wireless signal to a networking device 610, which then dispatches data representing an electronic notification 625 across the internet 615 to a user device 620. The electronic notification 625 may be displayed via the user interface of the user device 620 in order to alert the user of an issue with the surge protector apparatus and/or an electronic device. In some embodiments, the electronic notification 625 may be transmitted to user device(s) of a property owner, a property manager, an electric utility company, a technician, a product manufacturer, etc. In some embodiments, the user may be able to remotely perform additional diagnostic functionalities using the information included in the electronic notification 625.

Figure 7:
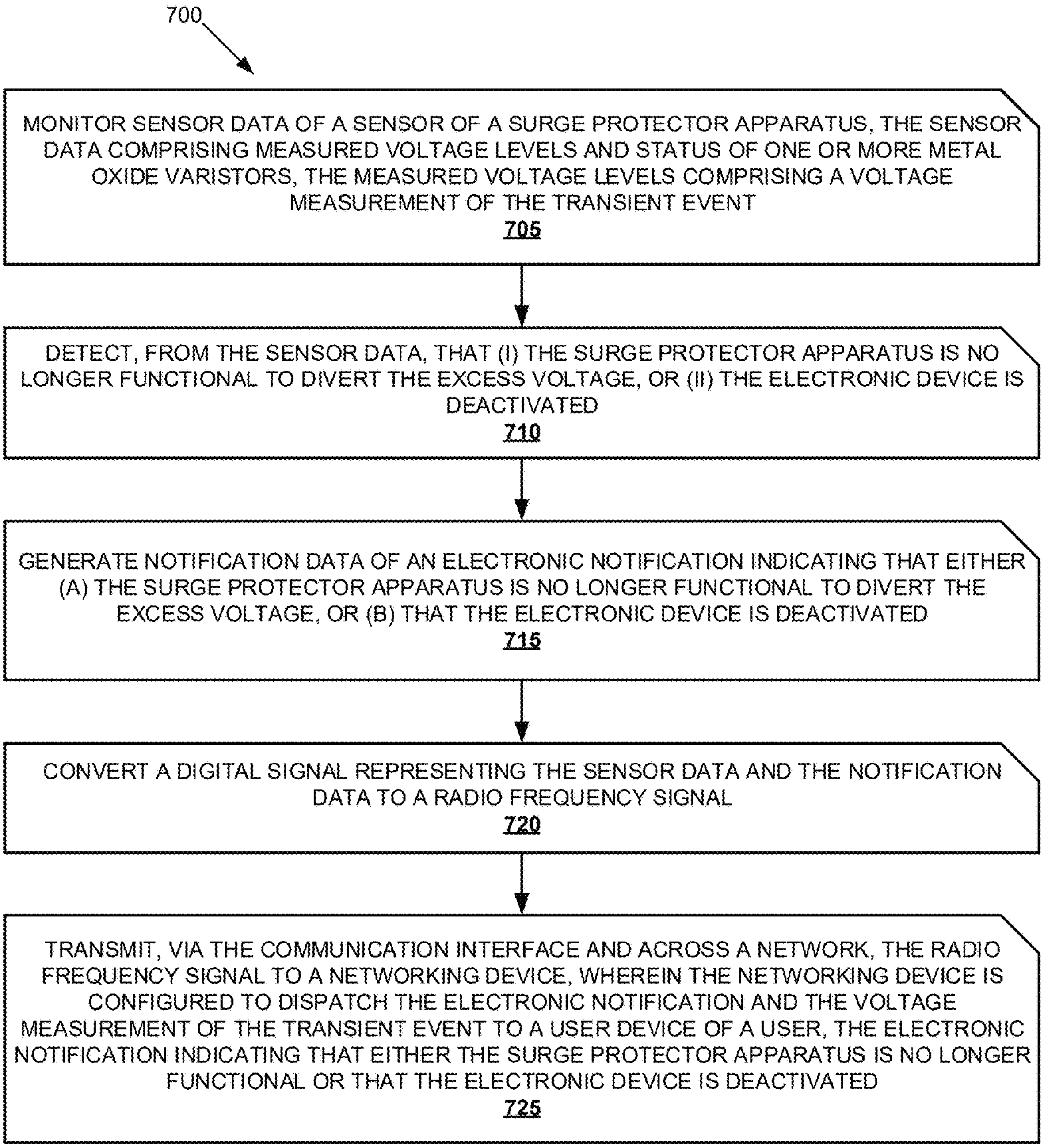
FIG. 7 depicts a block diagram of an example method for transmitting an electronic notification, in accordance with an embodiment of the present invention.

FIG. 7 depicts a block diagram of an example method 700 for transmitting an electronic notification, in accordance with an embodiment of the present invention. At block 705, at least one processor of a surge protector apparatus monitors sensor data of a sensor of the surge protector apparatus, where the sensor data includes measured voltage levels, and status of one or more metal oxide varistors. In some embodiments, the sensor generates the sensor data, and the sensor may be configured to detect that the surge protector apparatus is no longer functional. The measured voltage levels include a voltage measurement of the transient event. In some embodiments, status of the one or more metal oxide varistors (MOVs) is monitored based on deriving capacitance of the MOV(s), whereas in other embodiments, the sensor data itself may indicate the status of the MOV(s). In some embodiments, the status of the MOV may be derived based on a decrease in conduction voltage. The MOV(s) may be operatively coupled to an electrical system, where the electrical system includes a line side and a load side. The MOV(s) may be configured to divert excess voltage during a transient event on the line side, thereby protecting the load side. The electronic device may be deactivated in order to protect the electronic device from changes in voltage, particularly if the electronic device is a type of sensitive electronic appliance. In some embodiments, the electronic device comprises a compressor of an air conditioning system. Typically, compressors have built-in over/under voltage protection so that when the voltage is over or under a threshold, the compressor turns off. This protection is useful when, for example, the voltage is too low the motor will draw more current than needed and the temperature of the motor windings will significantly increase causing damage to the motor. Similarly, the compressor can be damaged because of excess voltage as well. Thus, positioning a surge protector between the power source and the compressor can protect the compressor. Further, the compressor may be deactivated the compressor may be deactivated due to opening the load (AC thermostat) if the voltage levels go too high or too low.

At block 710, the at least one processor detects, from the sensor data, that either (i) the surge protector apparatus is no longer functional to divert the excess voltage, or (ii) the electronic device is deactivated. According to one embodiment, the reason that the surge protector apparatus is no longer functional is due to failure of at least one of the one or more MOV(s). For example, at least one of the one or more MOV(s) may melt, burn, or be otherwise damaged due to a transient event. If the transient event is a lightning strike, for example, the energy involved is many orders of magnitude greater than the MOV can accommodate, which may cause the MOV to fail. In some embodiments, multiple MOVs can be aligned in parallel in order to reduce the probability of the MOV failing, but for various reasons (e.g., efficiency, spatial constraints, cost, production capabilities, etc.) the number of MOVs may be limited. In various embodiments, the MOV(s) may be configured to divert the excess voltage via at least one neutral wire (i.e., ground wire). In some embodiments, the sensor may be configured to detect that at least one of the MOV(s) is not operatively connected to a neutral wire such that the MOV(s) is able to adequately divert the excess voltage away from the load side.

At block 715, notification data of an electronic notification is generated, where the electronic notification indicates that either (a) the surge protector apparatus is no longer functional to divert the excess voltage or (b) that the electronic device is deactivated. At block 720, the at least one processor converts a digital signal representing the sensor data and/or the notification data to a radio frequency signal, and at block 725 transmits, via the communication interface and across a network, the radio frequency signal to a networking device. The networking device is configured to dispatch the electronic notification and/or the voltage measurement of the transient event to a user device of a user, where the electronic notification indicates either that the surge protector apparatus is no longer functional or that the electronic device is deactivated, depending on the setup and the problem that has been detected. For instance, the radio frequency signal may be transmitted over Wi-Fi, which uses radio waves between the networking device and the surge protector apparatus. The surge protector apparatus may include a wireless adapter that converts the data into a radio signal and sends out the radio signal via a transceiver and antenna. In some embodiments, the networking device includes a wireless router. In some instances, the radio frequency signal is dispatched through multiple networking devices such as, for example, a modem (i.e., a modulator-demodulator) that transmits data by modulating carrier wave signals to encode digital information.

In some embodiments, the sensor data may be stored to a storage location (e.g., RAM, ROM, cache, etc.) of either the surge protector apparatus itself or external server. The sensor data may include a log of measured voltage levels that are detected via a sensor of the surge protector apparatus. Advantageously, a log of measured voltage levels can be provided to an electric utility provider and/or technician to facilitate diagnosing whatever issue may be causing the surge protector apparatus to no longer function to divert excess voltage or to facilitate diagnosing why the electronic device is deactivated.

In some embodiments, illumination of an LED may also occur in addition to the electronic notification. In some embodiments, the surge protector apparatus may have multiple LEDs to indicate different conditions and/or the status of the surge protector apparatus. In some embodiments, different coloration of the LED(s) may be used to indicate the condition and/or status of the surge protector apparatus.

The terminology used herein is for describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated Computer program instructions are configured to carry out operations of the present invention and may be or may incorporate assembler instructions, instruction-set-architecture (ISA) instructions, machine instructions, machine dependent instructions, microcode, firmware instructions, state-setting data, source code, and/or object code written in any combination of one or more programming languages.

An application program may be deployed by providing computer infrastructure operable to perform one or more embodiments disclosed herein by integrating computer readable code into a computing system thereby performing the computer-implemented methods disclosed herein.

Although various computing environments are described above, these are only examples that can be used to incorporate and use one or more embodiments. Many variations are possible.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of one or more aspects of the invention and the practical application thereof, and to enable others of ordinary skill in the art to understand one or more aspects of the invention for various embodiments with various modifications as are suited to the particular use contemplated.

It is to be noted that various terms used herein such as "Linux®," "Windows®," "macOS®," "iOS®," "Android®," and the like may be subject to trademark rights in various jurisdictions throughout the world and are used here only in reference to the products or services properly denominated by the marks to the extent that such trademark rights may exist.

What is claimed is:

1. A surge protector apparatus, comprising:

one or more metal oxide varistors operatively coupled to an electrical system, the electrical system comprising a line side and a load side, the one or more metal oxide varistors being configured to divert excess voltage during a transient event on the line side thereby protecting the load side;

at least one processor;

a communication interface communicatively coupled to the at least one processor; and a memory device storing executable code that, when executed, causes the at least one processor to:

monitor sensor data comprising measured voltage levels and status of the one or more metal oxide varistors, the measured voltage levels comprising a voltage measurement of the transient event;

detect, from the sensor data, that (i) the surge protector apparatus is no longer functional to divert the excess voltage, or (ii) an electronic device at the load side is deactivated;

generate notification data of an electronic notification indicating that either (a) the surge protector apparatus is no longer functional to divert the excess voltage, or (b) that the electronic device is deactivated;

convert a digital signal representing the sensor data and the notification data to a radio frequency signal; and transmit, via the communication interface and across a network, the radio frequency signal to a networking device, wherein the networking device is configured to dispatch the electronic notification and the voltage measurement of the transient event to a user device of a user, wherein the user device displays, via a user interface of the user device, a log of measured voltage levels that visually differentiates the voltage measurement of the transient event from other measured voltage levels, the electronic notification indicating that either the surge protector apparatus is no longer functional or that the electronic device is deactivated.

2. The surge protector apparatus of claim 1, wherein the surge protector apparatus is no longer functional due to failure of at least one of the one or more metal oxide varistors.

3. The surge protector apparatus of claim 1, wherein the networking device comprises a wireless router.

4. The surge protector apparatus of claim 1, further comprising a sensor configured to generate the sensor data, wherein the sensor is configured to detect that the surge protector apparatus is no longer functional.

5. The surge protector apparatus of claim 4, wherein the sensor is further configured to detect that at least one of the one or more metal oxide varistors is not operatively connected to a neutral wire such that the one or more metal oxide varistors is able to divert the excess voltage away from the load side.

6. The surge protector apparatus of claim 1, wherein the one or more metal oxide varistors is configured to divert the excess voltage via at least one neutral wire.

7. The surge protector apparatus of claim 1, wherein the sensor data is stored to a storage location that comprises the log of measured voltage levels that are detected via a sensor of the surge protector apparatus.

8. The surge protector apparatus of claim 1, wherein the status of the one or more metal oxide varistors is derived based on capacitance of the one or more metal oxide varistors.

9. The surge protector apparatus of claim 1, wherein the status of the one or more metal oxide varistors is derived based on a decrease in conduction voltage.

10. An electrical system, comprising:

an electronic device; and a surge protector apparatus, the surge protector apparatus comprising:

one or more metal oxide varistors electrically coupled to the electronic device at a line side of the one or more metal oxide varistors, the one or more metal oxide varistors being configured to divert excess voltage during a transient event on the line side thereby protecting a load side of the one or more metal oxide varistors;

at least one processor;

a communication interface communicatively coupled to the at least one processor; and a memory device storing executable code that, when executed, causes the at least one processor to:

monitor sensor data comprising measured voltage levels and status of the one or more metal oxide varistors, the measured voltage levels comprising a voltage measurement of the transient event;

detect, from the sensor data, that (i) the surge protector apparatus is no longer functional to divert the excess voltage, or (ii) the electronic device is deactivated;

generate notification data of an electronic notification indicating that either (a) the surge protector apparatus is no longer functional to divert the excess voltage, or (b) that the electronic device is deactivated;

convert a digital signal representing the sensor data and the notification data to a radio frequency signal; and transmit, via the communication interface and across a network, the radio frequency signal to a networking device, wherein the networking device is configured to dispatch the electronic notification and the voltage measurement of the transient event to a user device of a user, wherein the user device displays, via a user interface of the user device, a log of measured voltage levels that visually differentiates the voltage measurement of the transient event from other measured voltage levels, the electronic notification indicating that either the surge protector apparatus is no longer functional or that the electronic device is deactivated.

11. The system of claim 10, wherein the surge protector apparatus is no longer functional due to failure of at least one of the one or more metal oxide varistors.

12. The system of claim 10, wherein the networking device comprises a wireless router.

13. The system of claim 10, wherein the surge protector apparatus further comprises a sensor configured to generate the sensor data, wherein the sensor is configured to detect that the surge protector apparatus is no longer functional.

14. The system of claim 13, wherein the sensor is further configured to detect that at least one of the one or more metal oxide varistors is not operatively connected to a neutral wire such that the one or more metal oxide varistors is able to divert the excess voltage away from the load side.

15. The system of claim 10, wherein the sensor data measured voltage level is stored to a storage location that comprises the log of measured voltage levels that are detected via a sensor of the surge protector apparatus.

16. The system of claim 10, wherein the electronic device comprises a compressor of an air conditioning system.

17. A computer-implemented method for transmitting an electronic notification, the method comprising:

monitoring sensor data of a sensor of a surge protector apparatus, the sensor data comprising measured voltage levels and status of one or more metal oxide varistors, the measured voltage levels comprising a voltage measurement of a transient event;

detecting, from the sensor data, that (i) the surge protector apparatus is no longer functional to divert the excess voltage, or (ii) an electronic device is deactivated in response to the transient event;

generating, based on the detecting, notification data of the electronic notification indicating either that (a) the surge protector apparatus is no longer functional to divert the excess voltage, or (b) the electronic device is deactivated;

converting, via a converter, a digital signal representing the sensor data and the notification data to a radio frequency signal; and transmitting, via the communication interface and across a network, the radio frequency signal to a networking device, wherein the networking device is configured to dispatch the electronic notification and the voltage measurement of the transient event to a user device of a user, wherein the user device displays, via a user interface of the user device, a log of measured voltage levels that visually differentiates the voltage measurement of the transient event from other measured voltage levels, the electronic notification indicating that either the surge protector apparatus is no longer functional, or that the electronic device is deactivated.

18. The computer-implemented method of claim 17, further comprising storing the sensor data to the log of measured voltage levels that are detected via the sensor.

19. The computer-implemented method of claim 17, wherein the surge protector apparatus is no longer functional due to failure of at least one of the one or more metal oxide varistors.

20. The computer-implemented method of claim 17, wherein the one or more metal oxide varistors are operatively coupled to an electrical system, the electrical system comprising a line side and a load side, the one or more metal oxide varistors being configured to divert excess voltage during a transient event on the line side thereby protecting the load side.

* * * * *